United States Patent
Ueda et al.

[11] Patent Number: 5,985,427
[45] Date of Patent: Nov. 16, 1999

[54] COATED CARBIDE ALLOY CUTTING MEMBER EXHIBITING EXCELLENT RESISTANCE AGAINST CHIPPING

[75] Inventors: Toshiaki Ueda, Ibaragi-ken; Eiji Nakamura, Saitama; Takashi Yamada, Ibaragi-ken; Takatoshi Oshika, Saitama, all of Japan

[73] Assignee: Mitsubishi Materials Corporation, Tokyo, Japan

[21] Appl. No.: 08/791,100

[22] Filed: Jan. 24, 1997

[30] Foreign Application Priority Data

| Jan. 24, 1996 | [JP] | Japan | 8-009930 |
| Mar. 25, 1996 | [JP] | Japan | 8-068115 |
| Mar. 25, 1996 | [JP] | Japan | 8-068120 |
| Apr. 16, 1996 | [JP] | Japan | 8-093967 |

[51] Int. Cl.$^6$ ........................................ B32B 15/04
[52] U.S. Cl. ................... 428/216; 428/469; 428/472; 428/697; 428/698; 428/699; 428/701; 428/702; 428/336; 51/307; 51/309
[58] Field of Search ................... 428/697, 701, 428/702, 699, 698, 469, 472, 336, 216; 51/307, 309

[56] References Cited

U.S. PATENT DOCUMENTS

| 4,180,400 | 12/1979 | Smith et al. | 75/235 |
| 4,525,415 | 6/1985 | Porat | 428/698 |
| 4,532,149 | 7/1985 | McHargue | 428/426 |
| 4,746,563 | 5/1988 | Nakama et al. | 428/701 |
| 4,758,451 | 7/1988 | Van den Berg et al. | 427/249 |
| 5,516,588 | 5/1996 | Van den Berg et al. | 428/469 |

*Primary Examiner*—Archene Turner
*Attorney, Agent, or Firm*—Oblon, Spivak, McClelland, Maier & Neustadt, P.C.

[57] ABSTRACT

A coated carbide alloy cutting member is provided exhibiting excellent resistance against chipping, wherein the cutting member has a cemented carbide substrate and one or more hard coating layers including an aluminum oxide-based layer primarily of aluminum oxide, the hard coating layers having an average thickness of 3 to 20 μm and being formed on the cemented carbide substrate by chemical and/or physical vapor deposition; and wherein the aluminum oxide-based layer contains 0.005 to 0.5 percent by weight of chlorine.

5 Claims, No Drawings

COATED CARBIDE ALLOY CUTTING MEMBER EXHIBITING EXCELLENT RESISTANCE AGAINST CHIPPING

BACKGROUND OF THE INVENTION

1. Field of the Invention

The present invention relates to a cutting tool having a cutting member comprising a coated carbide alloy (hereinafter referred to as "coated carbide cutting member") wherein a thick, uniform $Al_2O_3$-based layer consisting essentially of aluminum oxide (hereinafter $Al_2O_3$) is formed as a hard coating layer. The cutting member exhibits no chipping in continuous and interrupted cutting of metal, such as steel or cast iron, and exhibits stable cutting ability for long periods.

2. Discussion of the Background

Coated carbide cutting members are known in which the cutting members comprise a cemented carbide substrate (hereinafter carbide substrate) and hard coating layers comprising an $Al_2O_3$ layer and at least one layer, for example, selected from the group consisting of a titanium carbide (TiC) layer, a titanium nitride (TiN) layer, a titanium carbonitride (TiCN) layer, a titanium oxide (TiO$_2$) layer, a titanium carboxide (TiCO) layer, a titanium nitroxide (TiNO) layer, and a titanium carbonitroxide (TiCNO) layer, and where the hard coating layers are formed by chemical and/or physical vapor deposition and have an overall average thickness of 3 to 20 μm.

Further, it is also known to form the $Al_2O_3$ layer composing the hard coating layer from a reactive gas comprising 1 to 20 percent by volume of aluminum trichloride ($AlCl_3$), 0.5 to 30 percent by volume of carbon dioxide ($CO_2$), 1 to 30 percent by volume of carbon monoxide (CO) or hydrogen chloride (HCl) if necessary, and the balance being hydrogen, at a reaction temperature of 950 to 1,100° C. and an atmospheric pressure of 20 to 200 torr.

Recently, highly durable coated carbide cutting members have been in demand due to the promotion of factory automation and labor saving in cutting. Among hard coating layers, thickening of the $Al_2O_3$ layer which provides excellent resistance against oxidation, thermal stability and high hardness, has been investigated in response to such demands. However, it is inevitable that the $Al_2O_3$ layer creates local nonuniformities in conventional deposition processes for thickening, and the resulting cutting members have significant nonuniformity in thickness between the flank, rake and edge (the cross of the flank and the rake). When such cutting members are used for the interrupted cutting of steel and cast iron, the cutting tool easily chips, resulting in a relatively short lifetime for the cutting tool.

SUMMARY OF THE INVENTION

Accordingly, one object of the present invention is to provide a method for producing a coated carbide cutting member having improved resistance against chipping of the deposited $Al_2O_3$ layer forming a hard coating layer on the coated carbide cutting member.

A further object of the present invention is to provide a coated carbide cutting member having improved chip resistance.

These and other objects of the present invention have been satisfied by the discovery of a coated carbide alloy cutting member comprising a cemented carbide substrate and one or more hard coating layers, wherein one of said hard coating layers comprise an $Al_2O_3$-based layer consisting essentially of aluminum oxide, said hard coating layers having an overall average thickness of 3 to 20 μm and being formed on said cemented carbide substrate by chemical and/or physical vapor deposition, wherein the aluminum oxide-based layer contains 0.005 to 0.5 percent by weight of chlorine, and a method for its production.

DETAILED DESCRIPTION OF THE PREFERRED EMBODIMENTS

The $Al_2O_3$ layer (hereinafter $Al_2O_3$-based layer) which is formed by the present process exhibits excellent oxidation resistance, thermal stability and high hardness. The $Al_2O_3$-based layer of the present coated carbide cutting member is preferably formed by CVD or plasma CVD using a reactive gas containing 1 to 10 percent by volume of $AlCl_3$, 1 to 5 percent by volume of hydrogen ($H_2$), 5 to 15 percent by volume of nitrogen oxide ($NO_x$), and 0.05 to 0.7 percent by volume of titanium tetrachloride ($TiCl_4$) in an inert carrier gas at a temperature of 850 to 1,150° C. and a pressure of 20 to 200 torr. The resulting layer contains chlorine.

The crystals in the layer are made as fine crystals by controlling the chlorine content from 0.005 to 0.5 percent by weight (hereinafter all percentages given are percent by weight unless otherwise specified). Further, local fluctuations in the thickness caused by thickening of the layer can be significantly reduced by controlling the composition of the reactive gas and the atmosphere so that the Ti content is 1.5 to 15 percent and the Cl content is 0.05 to 0.5 percent in the layer. The resulting cutting member has excellent uniformity in thickness between the flank, rake and edge (the cross of the flank and the rake).

Moreover, coarsening of the crystal grains in the thick layer can be reduced by controlling the Zr and/or Hf contents from 0.5 to 10 percent. The coated carbide cutting member of the present invention comprising a hard coating layer including the $Al_2O_3$-based layer containing chlorine is durable to long-term continuous and interrupted cutting of steel and cast iron without chipping of the cutting member.

Within the context of the present invention, the term "cutting member" refers to those members which have a function to actually cut off the metal work piece, including, but not limited to, exchangeable cutting inserts for mounting on a face milling cutter body, a bit shank of a turning tool, and a cutting blade of an end mill.

The coated carbide alloy cutting member of the present invention exhibits excellent resistance against chipping and comprises: a cemented carbide substrate and hard coating layers, including an $Al_2O_3$-based layer consisting essentially of aluminum oxide, having an overall average thickness of 3 to 20 μm and formed on the cemented carbide substrate by chemical and/or physical vapor deposition; wherein the $Al_2O_3$-based layer contains 0.005 to 0.5 percent of chlorine. While the mechanism of the improvement in resistance against chipping is not fully understood, it is believed to be due to fining of the crystal grains in the deposited layer.

In the present invention, the Cl content of the $Al_2O_3$-based layer composing the hard coating layer of the coated carbide cutting member is 0.005 to 0.5 percent, preferably 0.02 to 0.4 percent, more preferably 0.05 to 0.3 percent. When the Cl content is less than 0.005 percent, the advantages set forth above cannot be achieved. On the other hand, a Cl content of over 0.5 percent causes loss of characteristics, such as wear resistance, generally inherent to the $Al_2O_3$-based layer.

A layer having a uniform thickness can be formed in the presence of both Ti and Cl components. Satisfactory results cannot be achieved if the Ti content is less than 1.5 percent or the Cl content is less than 0.005 percent. On the other hand, the excellent characteristics inherent to the $Al_2O_3$-based layer deteriorate if the Ti content exceeds 15 percent or the Cl content exceeds 0.5 percent. Thus, the Ti content is set from 1.5 to 15 percent and the Cl content is set from 0.005 to 0.5 percent.

Coarsening of the crystal grains decreases the excellent characteristics of the $Al_2O_3$-based layer, but this can be reduced with the addition of Zr and/or Hf, particularly in the case of thicker layers. Satisfactory results cannot be achieved if the content is less than 0.5 percent. On the other hand, the excellent characteristics achieved by the $Al_2O_3$-based layer deteriorate if the content exceeds 10 percent. Thus, the Zr and/or Hf content is set from 0.5 to 10 percent.

It is preferable that the total content of Ti, Cl, Zr and Hf in the $Al_2O_3$-based layer be controlled to be no greater than 17.5 percent, because the wear resistance begins to significantly decrease if the total content exceeds this upper limit.

The average thickness of the hard coating layer is preferably from 3 to 20 $\mu$m. Excellent wear resistance is difficult to achieve at a thickness of less than 3 $\mu$m, whereas damage and chipping of the cutting member easily occur at a thickness of over 20 $\mu$m.

EXAMPLES

Having generally described this invention, a further understanding can be obtained by reference to certain specific examples which are provided herein for purposes of illustration only and are not intended to be limiting unless otherwise specified.

Example 1

The following powders were prepared as raw materials: a WC powder with an average grain size of 2.8 $\mu$m; a coarse WC powder with an average grain size of 4.9 $\mu$m; a TiC/WC powder with an average grain size of 1.5 $\mu$m (TiC/WC=30/70 by weight); a (Ti,W)CN powder with an average grain size of 1.2 $\mu$m (TiC/TiN/WC=24/20/56 by weight); a TaC/NbC powder with an average grain size of 1.2 $\mu$m (TaC/NbC=90/10 by weight); and a Co powder with an average grain size of 1.1 $\mu$m. These powders were compounded based on the formulation shown in Table 1, wet-mixed in a ball mill for 72 hours, and dried. The dry mixture was pressed to form a green compact for a cutting insert as defined in ISO-CNMG120408 (for carbide substrates A through D) or ISO-SEEN42AFTN1 (for carbide substrate E), followed by vacuum sintering under the conditions set forth in Table 1. Carbide substrates A through E were prepared in such a manner.

The carbide substrate B was held in a $CH_4$ atmosphere at a pressure of 100 torr at 1400° C. for 1 hour, followed by annealing for carburization. The carburized substrate was subjected to treatment by acid and barrel finishing to remove carbon and cobalt on the substrate surface. The substrate was covered with a Co-enriched zone having a thickness of 42 $\mu$m and a maximum Co content of 15.9 percent by weight at a depth of 11 $\mu$m from the surface of the substrate.

Sintered carbide substrates A and D had a Co-enriched zone with a thickness of 23 $\mu$m and a maximum Co content of 9.1 percent by weight at a depth 17 $\mu$m from the surface of the substrate. Carbide substrates C and E had no Co-enriched zone and had homogeneous microstructures.

The Rockwell hardnesses (Scale A) of each of the carbide substrates A through E are shown in Table 1.

The surfaces of the carbide substrates A through E were subjected to honing and chemical vapor deposition using conventional equipment under the conditions shown in Tables 2 and 3 to form hard coating layers having a specified composition and target thickness (at the flank of the cutting insert), wherein l-TiCN in Table 2 represents TiCN having a crystal structure longitudinally grown as described in Japanese Unexamined Patent Publication No. 6-8010, p-TiCN in the same table represents TiCN having a general crystal grain structure, each $Al_2O_3$ (a) through (e) in Table 3 represents an $Al_2O_3$-based layer, and $Al_2O_3$ (f) represents an $Al_2O_3$ layer (the same as in Tables 4 and 5). Coated carbide cutting inserts 1 through 10 in accordance with the present invention and conventional coated carbide cutting inserts 1 through 10 were produced in such a manner.

The resulting coated carbide cutting inserts were subjected to measurement of the maximum thickness of the $Al_2O_3$-based layer and the $Al_2O_3$ layer of the cutting edge, at the point where the flank and the rake cross each other (in Tables 6 and 7, both are referred to as merely $Al_2O_3$ layer). Further, the thicknesses of those layers at the flank and rake at positions 1 mm from the cutting edge were measured. These results are shown in Tables 6 and 7.

In the hard coated layer, the thicknesses of layers, other than both the $Al_2O_3$ layer and the $Al_2O_3$-based layer, did not have substantial local fluctuations and were identical to the designed thicknesses.

The $Al_2O_3$-based layer of the present cutting insert or the conventional $Al_2O_3$ layer was subjected to elemental analysis using an EPMA (electron probe micro analyzer). When the top surface was a TiN layer, the TiN layer was removed with aqueous hydrogen peroxide before the analysis. The cutting inserts used for elemental analysis were identical to the ones used in the cutting test. The elemental analysis was carried out by irradiating an electron beam having a diameter of 1 mm onto the center of the flank for cutting inserts having a shape as defined in ISO-CNMG120408 or onto the center of the rake for cutting inserts having a shape as defined in ISO-SEEN42AFTN1.

As a result, the $Al_2O_3$-based layers of the present coated carbide cutting inserts contained (by weight) 52.8 to 53.1 percent of Al, 46.5 to 46.9 percent of 0, and 0.014 to 0.38 percent of Cl, whereas the conventional $Al_{23}$ layers contained 52.8 to 53.0 percent of Al and 47.0 to 47.2 percent of 0, while no Cl was detected.

The resistance against chipping of present coated carbide cutting inserts 1 and 2 and conventional coated carbide cutting inserts 1 and 2 was evaluated by dry continuous and interrupted cutting tests as follows:

Conditions for dry continuous cutting test of ductile cast iron

Material to be cut: round bar based on JIS-FCD450

Cutting speed: 200 m/min.

Depth of cut: 2.0 mm

Feed rate: 0.3 mm/rev.

Cutting time: 20 minutes

Conditions for dry interrupted cutting test of ductile cast iron

Material to be cut: round bar based on JIS-FCD450 with four longitudinal grooves equally spaced Cutting speed: 150 m/min.

Depth of cut: 2.0 mm

Feed rate: 0.25 mm/rev.

Cutting time: 5 minutes

The resistance against chipping in each test was evaluated by flank wear.

The resistance against chipping of present coated carbide cutting inserts 3 and 4 and conventional coated carbide cutting inserts 3 and 4 was evaluated by dry continuous and interrupted cutting tests as follows:

Conditions for dry continuous cutting test of alloy steel

Material to be cut: round bar based on JIS-SNCM439

Cutting speed: 200 m/min.

Depth of cut: 2.0 mm

Feed rate: 0.3 mm/rev.

Cutting time: 20 minutes

Conditions for dry interrupted cutting test of alloy steel

Material to be cut: round bar based on JIS-SNCM439 with four longitudinal grooves equally spaced Cutting speed: 150 m/min.

Depth of cut: 2.0 mm

Feed rate: 0.25 mm/rev.

Cutting time: 5 minutes

The resistance against chipping in each test was evaluated by flank wear.

The resistance against chipping of present coated carbide cutting inserts 5 and 6 and conventional coated carbide cutting inserts 5 and 6 was evaluated by dry continuous and interrupted cutting tests as follows:

Conditions for dry continuous cutting test of carbon steel

Material to be cut: round bar based on JIS-S45C cutting speed: 200 m/min.

Depth of cut: 2.0 mm

Feed rate: 0.3 mm/rev.

Cutting time: 20 minutes

Conditions for dry interrupted cutting test of carbon steel

Material to be cut: round bar based on JIS-S45C with four longitudinal grooves equally spaced Cutting speed: 150 m/min.

Depth of cut: 2.0 mm

Feed rate: 0.25 mm/rev.

Cutting time: 5 minutes

The resistance against chipping in each test was evaluated by flank wear.

The resistance against chipping of present coated carbide cutting inserts 7 and 8 and conventional coated carbide cutting inserts 7 and 8 was evaluated by dry continuous and interrupted cutting tests as follows:

Conditions for dry continuous cutting test of cast iron

Material to be cut: round bar based on JIS-FC300

Cutting speed: 250 m/min.

Depth of cut: 2.0 mm

Feed rate: 0.3 mm/rev.

Cutting time: 20 minutes

Conditions for dry interrupted cutting test of cast iron

Material to be cut: round bar based on JIS-FC300 with four longitudinal grooves equally spaced Cutting speed: 150 m/min.

Depth of cut: 2.0 mm

Feed rate: 0.25 mm/rev.

Cutting time: 5 minutes

The resistance against chipping in each test was evaluated by flank wear.

The resistance against chipping of present coated carbide cutting inserts 9 and 10 and conventional coated carbide cutting inserts 9 and 10 was evaluated by a dry milling test as follows:

Conditions for dry milling test of alloy steel

Material to be cut: square bar of 100-mm wide and 500-mm long based on JIS-SCM440

Cutting tool configuration: single cutting insert mounted with a cutter of 125-mm diameter Rotation: 510 r.p.m.

Cutting speed: 200 m/min.

Depth of cut: 1.5 mm

Feed rate: 0.2 mm/tooth

Cutting time: 3 passes (5.3 minutes per pass)

The resistance against chipping in each test was evaluated by flank wear.

These results are shown in Tables 6 and 7.

Example 2

The same carbide substrates A through E used in EXAMPLE 1 were prepared. The surfaces of the carbide substrates A through E were subjected to honing and chemical vapor deposition using conventional equipment under the conditions shown in Tables 2 and 8 to form hard coating layers having a specified composition and thickness (at the flank of the cutting insert), wherein each $Al_2O_3$ (a) through (h) in Table 8 represents an $Al_2O_3$-based layer, and $Al_2O_3$ (i) represents an $Al_2O_3$ layer (the same as in Tables 9 and 10). Present invention coated carbide cutting inserts 11 through 27 and conventional coated carbide cutting inserts 11 through 20 were produced in such a manner.

The resulting coated carbide cutting inserts were subjected to measurement of the maximum thickness of the $Al_2O_3$-based layer and the $Al_2O_3$ layer of the cutting edge, at the point at which the flank and the rake cross each other (in Tables 11 and 12, both are referred to as merely the $Al_2O_3$ layer). Further, the thicknesses of these layers at the flank and rake at positions 1 mm from the cutting edge were measured. These results are shown in Tables 11 and 12.

In the hard coating layer, the thicknesses of layers, other than both the $Al_2O_3$ layer and the $Al_2O_3$-based layer, did not have substantial local fluctuations and were identical to the specified thicknesses.

Both the $Al_2O_3$-based layer of the cutting insert in accordance with the present invention and the conventional $Al_2O_3$ layer were subjected to elemental analysis using an EPMA (electron probe micro analyzer). Elemental analysis was carried out using the same procedure as in Example 1.

The $Al_2O_3$-based layers of the coated carbide cutting inserts in accordance with the present invention contained (by weight) 39.9 to 51.9 percent of Al, 46.0 to 46.4 percent of O, 2.1 to 12.9 percent of Ti, and 0.011 to 0.18 percent of Cl, whereas the conventional $Al_2O_3$ layers contained 52.8 to 53.0 percent of Al and 47.0 to 47.2 percent of O, while Ti and Cl were not detected.

The resistance against chipping of present coated carbide cutting inserts 11 through 18 and conventional coated carbide cutting inserts 11 through 14 was evaluated by dry continuous and interrupted cutting tests as follows:

Conditions for dry continuous cutting test of alloy steel

Material to be cut: round bar based on JIS-SCM440

Cutting speed: 300 m/min.

Depth of cut: 1.5 mm

Feed rate: 0.3 mm/rev.

Cutting time: 15 minutes
Conditions for dry interrupted cutting test of alloy steel
   Material to be cut: round bar based on JIS-SCM440 with four longitudinal grooves equally spaced
   Cutting speed: 150 m/min.
   Depth of cut: 2.0 mm
   Feed rate: 0.3 mm/rev.
   Cutting time: 5 minutes
The resistance against chipping in each test was evaluated by flank wear.
   The resistance against chipping of present coated carbide cutting inserts 19 through 23 and conventional coated carbide cutting inserts 15 and 16 was evaluated by dry continuous and interrupted cutting tests as follows:
   Conditions for dry continuous cutting test of ductile cast iron
   Material to be cut: round bar based on FCD450
   Cutting speed: 300 m/min.
   Depth of cut: 1.5 mm
   Feed rate: 0.3 mm/rev.
   Cutting time: 15 minutes
   Conditions for dry interrupted cutting test of ductile cast iron
   Material to be cut: round bar based on FCD450 with four longitudinal grooves equally spaced
   Cutting speed: 150 m/min.
   Depth of cut: 2.0 mm
   Feed rate: 0.3 mm/rev.
   Cutting time: 5 minutes
The resistance against chipping in each test was evaluated by flank wear.
   The resistance against chipping of present coated carbide cutting insert 24 and conventional coated carbide cutting insert 17 was evaluated by dry continuous and interrupted cutting tests as follows:
   Conditions for dry continuous cutting test of alloy steel
   Material to be cut: round bar based on JIS-SNCM439
   Cutting speed: 300 m/min.
   Depth of cut: 1.5 mm
   Feed rate: 0.3 mm/rev.
   Cutting time: 15 minutes
   Conditions for dry interrupted cutting test of alloy steel
   Material to be cut: round bar based on JIS-SNCM439 with four longitudinal grooves equally spaced
   Cutting speed: 150 m/min.
   Depth of cut: 2.0 mm
   Feed rate: 0.3 mm/rev.
   Cutting time: 5 minutes
The resistance against chipping in each test was evaluated by flank wear.
   The resistance against chipping of present coated carbide cutting insert 25 and conventional coated carbide cutting insert 18 was evaluated by dry continuous and interrupted cutting tests as follows:
   Conditions for dry continuous cutting test of carbon steel
   Material to be cut: round bar based on JIS-S45C
   Cutting speed: 300 m/min.
   Depth of cut: 1.5 mm
   Feed rate: 0.3 mm/rev.
   Cutting time: 15 minutes
   Conditions for dry interrupted cutting test of carbon steel
   Material to be cut: round bar based on JIS-S45C with four longitudinal grooves equally spaced
   Cutting speed: 150 m/min.
   Depth of cut: 2.0 mm
   Feed rate: 0.3 mm/rev.
   Cutting time: 5 minutes
The resistance against chipping in each test was evaluated by flank wear.
   The resistance against chipping of present coated carbide cutting insert 26 and conventional coated carbide cutting insert 19 was evaluated by dry continuous and interrupted cutting tests as follows:
   Conditions for dry continuous cutting test of cast iron
   Material to be cut: round bar based on JIS-FC300
   Cutting speed: 350 m/min.
   Depth of cut: 1.5 mm
   Feed rate: 0.3 mm/rev.
   Cutting time: 15 minutes
   Conditions for dry interrupted cutting test of cast iron
   Material to be cut: round bar based on JIS-FC300 with four longitudinal grooves equally spaced
   Cutting speed: 150 m/min.
   Depth of cut: 2.0 mm
   Feed rate: 0.3 mm/rev.
   Cutting time: 5 minutes
The resistance against chipping in each test was evaluated by flank wear.
   The resistance against chipping of present coated carbide cutting insert 27 and conventional coated carbide cutting insert 20 was evaluated by a dry milling test as follows:
   Conditions for dry milling test of alloy steel
   Material to be cut: square bar of 100-mm wide and 500-mm long based on JIS-SCM440
   Cutting tool configuration: single cutting insert mounted with a cutter of 125-mm diameter
   Rotation: 510 r.p.m.
   Cutting speed: 200 m/min.
   Depth of cut: 2.0 mm
   Feed rate: 0.2 mm/tooth
   Cutting time: 3 passes (5.3 minutes per pass)
The resistance against chipping in each test was evaluated by flank wear.
   These results are shown in Tables 11 and 12.

Example 3

The same carbide substrates A through E as prepared in EXAMPLE 1 were prepared. The surfaces of the carbide substrates A through E were subjected to honing and chemical vapor deposition using conventional equipment under the conditions shown in Tables 2 and 13 to form hard coating layers having a specified composition and target thickness (at the flank of the cutting insert), wherein each $Al_2O_3$ (a) through (i) in Table 13 represents an $Al2O_3$-based layer, and $Al_2O_3$ (j) represents an $Al_2O_3$ layer (the same as in Tables 14 and 15). Present invention coated carbide cutting inserts 28 through 40 and conventional coated carbide cutting inserts 21 through 30 were produced in such a manner.

Each resulting coated carbide cutting insert was subjected to measurement of the maximum thickness of the $Al_2O_3$-based layer and the $Al_2O_3$ layer of the cutting edge, at the point at which the flank and the rake cross each other, (in Tables 16 and 17, both are referred to as merely $Al_2O_3$ layer). Further, the thicknesses of those layers at the flank and rake at positions 1 mm from the cutting edge were measured. These results are shown in Tables 16 and 17.

In the hard coated layer, the thicknesses of layers other than both the $Al_2O_3$ layer and the $Al_2O_3$-based layer did not have substantial local fluctuations and were identical to the desired thicknesses.

The $Al_2O_3$-based layer of the present invention cutting insert and the conventional $Al_2O_3$ layer were each subjected to elemental analysis using an EPMA (electron probe micro analyzer). Elemental analysis was carried out by the same procedure used in Example 1.

The $Al_2O_3$-based layers of the present coated carbide cutting inserts contained (by weight) 41.1 to 52.1 percent of Al, 46.3 to 46.2 percent of O, 0.35 to 9.1 of Zr, 0.42 to 10.4 percent of Hf, and 0.014 to 0.15 percent of Cl, whereas the conventional $Al_2O_3$ layers contained 52.8 to 53.0 percent of Al and 47.0 to 47.2 percent of O, while Zr, Hf and Cl were not detected.

The resistance against chipping of present coated carbide cutting inserts 28 through 32 and conventional coated carbide cutting inserts 21 and 22 was evaluated by dry continuous and interrupted cutting tests as follows:

Conditions for dry continuous cutting test of ductile cast iron
  Material to be cut: round bar based on JIS-FCD700
  Cutting speed: 300 m/min.
  Depth of cut: 1.5 mm
  Feed rate: 0.3 mm/rev.
  Cutting time: 15 minutes
Conditions for dry interrupted cutting test of ductile cast iron
  Material to be cut: round bar based on JIS-FCD700 with four longitudinal grooves equally spaced
  Cutting speed: 150 m/min.
  Depth of cut: 2.0 mm
  Feed rate: 0.3 mm/rev.
  Cutting time: 5 minutes
The resistance against chipping in each test was evaluated by flank wear.

The resistance against chipping of present coated carbide cutting inserts 33 and 34 and conventional coated carbide cutting inserts 23 and 24 was evaluated by dry continuous and interrupted cutting tests as follows:

Conditions for dry continuous cutting test of alloy steel
  Material to be cut: round bar based on JIS-SCM440
  Cutting speed: 300 m/min.
  Depth of cut: 1.5 mm
  Feed rate: 0.3 mm/rev.
  Cutting time: 15 minutes
Conditions for dry interrupted cutting test of alloy steel
  Material to be cut: round bar based on JIS-SCM440 with four longitudinal grooves equally spaced
  Cutting speed: 150 m/min.
  Depth of cut: 2.0 mm
  Feed rate: 0.3 mm/rev.
  Cutting time: 5 minutes
The resistance against chipping in each test was evaluated by flank wear.

The resistance against chipping of present coated carbide cutting inserts 35 and 36 and conventional coated carbide cutting inserts 25 and 26 was evaluated by dry continuous and interrupted cutting tests as follows:

Conditions for dry continuous cutting test of carbon steel
  Material to be cut: round bar based on JIS-S30C
  Cutting speed: 300 m/min.
  Depth of cut: 1.5 mm
  Feed rate: 0.3 mm/rev.
  Cutting time: 15 minutes
Conditions for dry interrupted cutting test of carbon steel
  Material to be cut: round bar based on JIS-S30C with four longitudinal grooves equally spaced
  Cutting speed: 150 m/min.
  Depth of cut: 2.0 mm
  Feed rate: 0.3 mm/rev.
  Cutting time: 5 minutes
The resistance against chipping in each test was evaluated by flank wear.

The resistance against chipping of present coated carbide cutting inserts 37 and 38 and conventional coated carbide cutting inserts 27 and 28 was evaluated by dry continuous and interrupted cutting tests as follows:

Conditions for dry continuous cutting test of cast iron
  Material to be cut: round bar based on JIS-FC200
  Cutting speed: 350 m/min.
  Depth of cut: 1.5 mm
  Feed rate: 0.3 mm/rev.
  Cutting time: 15 minutes
Conditions for dry interrupted cutting test of cast iron
  Material to be cut: round bar based on JIS-FC200 with four longitudinal grooves equally spaced
  Cutting speed: 150 m/min.
  Depth of cut: 2.0 mm
  Feed rate: 0.3 mm/rev.
  Cutting time: 5 minutes
The resistance against chipping in each test was evaluated by flank wear.

The resistance against chipping of present coated carbide cutting inserts 39 and 40 and conventional coated carbide cutting inserts 29 and 30 was evaluated by a dry continual test as follows:

Conditions for dry milling test of alloy steel
  Material to be cut: square bar of 100-mm wide and 500-mm long based on JIS-SCM440
  Cutting tool configuration: single cutting insert mounted with a cutter of 125-mm diameter
  Rotation: 510 r.p.m.
  Cutting speed: 200 m/min.
  Depth of cut: 2.0 mm
  Feed rate: 0.2 mm/tooth
  Cutting time: 3 passes (5.3 minutes per pass)
The resistance against chipping in each test was evaluated by flank wear.

These results are shown in Tables 16 and 17.

Example 4

The same carbide substrates A through E as prepared in EXAMPLE 1 were prepared. The surfaces of the carbide substrates A through E were subjected to honing and chemical vapor deposition using conventional equipment under the conditions shown in Tables 2 and 18 to form hard coating layers having a specified composition and target thickness (at the flank of the cutting insert), wherein l-TiCN in Table 2 represents TiCN having a crystal structure longitudinally grown as described in Japanese Unexamined Patent Publication No. 6-8010, p-TiCN in the same table represents TiCN having a general crystal grain structure, each $Al_2O_3$ (a) through (k) in Table 18 represents an $Al_2O_3$-based layer, and $Al_2O_3$ (l) represents an $Al_2O_3$ layer (the same as in Tables 19 and 20). Present invention coated carbide cutting inserts 41 through 57 and conventional coated carbide cutting inserts 31 through 40 were produced in such a manner.

The resulting coated carbide cutting inserts were subjected to measurement of the maximum thickness of the $Al_2O_3$-based layer and the $Al_2O_3$ layer of the cutting edge, at the point at which the flank and the rake cross each other (in Tables 21 and 22, both are referred to as merely $Al_2O_3$ layer). Further, the thicknesses of the flank and rake at positions 1 mm from the cutting edge were measured. These results are shown in Tables 21 and 22.

In the hard coated layer, the thicknesses of the $Al_2O_3$-based layer and layers other than the $Al_2O_3$ layer did not have substantial local fluctuations and were identical to the desired thicknesses.

The $Al_2O_3$-based layer of the present invention cutting insert and the conventional $Al_2O_3$ layer were each subjected to elemental analysis using an EPMA (electron probe micro analyzer). Elemental analysis was carried out by the same procedure as Example 1.

The $Al_2O_3$-based layers of the present coated carbide cutting inserts contained (by weight) 39.1 to 50.7 percent of Al, 44.9 to 46.3 percent of O, 1.9 to 13.6 percent of Ti, 0.14 to 0.20 percent of Cl, 0.3 to 8.5 percent of Zr, and 0.3 to 9.6 percent of Hf, whereas the conventional $Al_2O_3$ layers contained 52.8 to 53.0 percent of Al and 47.0 to 47.2 percent of O, while Ti, Cl, Zr and Hf were not detected.

The resistance against chipping of present coated carbide cutting inserts 41 through 49 and conventional coated carbide cutting inserts 31 and 36 was evaluated by dry continuous and interrupted cutting tests as follows:

Conditions for dry continuous cutting test of ductile cast iron
  Material to be cut: round bar based on JIS-FCD700
  Cutting speed: 300 m/min.
  Depth of cut: 1.5 mm
  Feed rate: 0.3 mm/rev.
  Cutting time: 15 minutes
Conditions for dry interrupted cutting test of ductile cast iron
  Material to be cut: round bar based on JIS-FCD700 with four longitudinal grooves equally spaced
  Cutting speed: 150 m/min.
  Depth of cut: 2.0 mm
  Feed rate: 0.3 mm/rev.
  Cutting time: 5 minutes
The resistance against chipping in each test was evaluated by flank wear.

The resistance against chipping of present coated carbide cutting inserts 50 and 51 and conventional coated carbide cutting insert 37 was evaluated by dry continuous and interrupted cutting tests as follows:

Conditions for dry continuous cutting test of alloy steel
  Material to be cut: round bar based on JIS-SCM439
  Cutting speed: 300 m/min.
  Depth of cut: 1.5 mm
  Feed rate: 0.3 mm/rev.
  Cutting time: 15 minutes
Conditions for dry interrupted cutting test of alloy steel
  Material to be cut: round bar based on JIS-SCM439 with four longitudinal grooves equally spaced
  Cutting speed: 150 m/min.
  Depth of cut: 2.0 mm
  Feed rate: 0.3 mm/rev.
  Cutting time: 5 minutes
The resistance against chipping in each test was evaluated by flank wear.

The resistance against chipping of present coated carbide cutting inserts 52 and 53 and conventional coated carbide cutting insert 38 was evaluated by dry continuous and interrupted cutting tests as follows:

Conditions for dry continuous cutting test of carbon steel
  Material to be cut: round bar based on JIS-S45C
  Cutting speed: 300 m/min.
  Depth of cut: 1.5 mm
  Feed rate: 0.3 mm/rev.
  Cutting time: 15 minutes
Conditions for dry interrupted cutting test of carbon steel
  Material to be cut: round bar based on JIS-S45C with four longitudinal grooves equally spaced
  Cutting speed: 150 m/min.
  Depth of cut: 2.0 mm
  Feed rate: 0.3 mm/rev.
  Cutting time: 5 minutes
The resistance against chipping in each test was evaluated by flank wear.

The resistance against chipping of present coated carbide cutting inserts 54 and 55 and conventional coated carbide cutting insert 39 was evaluated by dry continuous and interrupted cutting tests as follows:

Conditions for dry continuous cutting test of cast iron
  Material to be cut: round bar based on JIS-FC200
  Cutting speed: 350 m/min.
  Depth of cut: 1.5 mm
  Feed rate: 0.3 mm/rev.
  Cutting time: 15 minutes
Conditions for dry interrupted cutting test of cast iron
  Material to be cut: round bar based on JIS-FC200 with four longitudinal grooves equally spaced
  Cutting speed: 150 m/min.
  Depth of cut: 2.0 mm
  Feed rate: 0.3 mm/rev.
  Cutting time: 5 minutes
The resistance against chipping in each test was evaluated by flank wear.

The resistance against chipping of present coated carbide cutting inserts 56 and 57 and conventional coated carbide cutting insert 40 was evaluated by a dry continual test as follows:

Conditions for dry milling test of alloy steel
  Material to be cut: square bar of 100-mm wide and 500-mm long based on JIS-SCM440
  Cutting tool configuration: single cutting insert mounted with a cutter of 125-mm diameter
  Rotation: 510 r.p.m.
  Cutting speed: 200 m/min.
  Depth of cut: 2.0 mm
  Feed rate: 0.2 mm/tooth
  Cutting time: 3 passes (5.3 minutes per pass)
The resistance against chipping in each test was evaluated by flank wear.

These results are shown in Tables 21 and 22.

TABLE 1

| Carbide Substrate | Composition (weight %) | | | | | Vacuum Sintering Conditions | | | Rockwell Hardness (scale A) (HRA) |
|---|---|---|---|---|---|---|---|---|---|
| | Co | (Ti,W)C | (Ti,W)CN | (Ta,Nb)C | WC | Vacuum (torr) | Temperature (° C.) | Time (hr) | |
| A | 6.3 | — | 6 | 4.1 | Balance | 0.10 | 1380 | 1 | 90.3 |
| B | 5.3 | 5.2 | — | 5.1 | Balance | 0.05 | 1450 | 1 | 90.9 |
| C | 9.5 | 8.1 | — | 4.9 | Balance | 0.05 | 1380 | 1.5 | 89.9 |
| D | 4.5 | — | 4.8 | 3.1 | Balance | 0.10 | 1410 | 1 | 91.4 |
| E | 10.2 | — | — | 2.2 | Balance (Coarse) | 0.05 | 1380 | 1 | 89.7 |

TABLE 2

Conditions for Forming Hard Coating Layer

| Hard Coating Layer | Composition of Reactive Gas (Volume %) | Pressure (torr) | Temperature (° C.) |
|---|---|---|---|
| TiC | $TiCl_4$: 4.2%, $CH_4$: 4.5%, $H_2$: Balance | 50 | 980 |
| TiN (First layer) | $TiCl_4$: 4.2%, $N_2$: 25%, $H_2$: Balance | 50 | 920 |
| TiN (Other layer) | $TiCl_4$: 4.2%, $N_2$: 30%, $H_2$: Balance | 200 | 1020 |
| l-TiCN | $TiCl_4$: 4.2%, $N_2$: 20%, $CH_3CN$: 0.6%, $H_2$: Balance | 50 | 910 |
| p-TiCN | $TiCl_4$: 4.2%, $N_2$: 20%, $CH_4$: 4%, $H_2$: Balance | 50 | 1020 |
| TiCO | $TiCl_4$: 2%, CO: 6%, $H_2$: Balance | 50 | 980 |
| TiNO | $TiCl_4$: 2%, NO: 6%, $H_2$: Balance | 50 | 980 |
| TiCNO | $TiCl_4$: 2%, CO: 3%, $H_2$: Balance | 50 | 980 |
| $TiO_2$ | $TiCl_4$: 2%, $CO_2$: 8%, $H_2$: Balance | 100 | 1000 |

TABLE 3

| Hard Coating Layer | | Conditions for Forming $Al_2O_3$ Layer | | |
|---|---|---|---|---|
| Kind | Designed Cl Content (weight %) | Composition of Reactive Gas (Volume %) | Pressure (torr) | Temperature (° C.) |
| $Al_2O_3$(a) | Cl: 0.005% | $AlCl_3$: 5.0%, NO: 15.0%, $H_2$: 5.0%, Ar: Balance | 50 | 1050 |
| $Al_2O_3$(b) | Cl: 0.01% | $AlCl_3$: 5.0%, NO: 15.0%, $H_2$: 3.0%, Ar: Balance | 50 | 1050 |
| $Al_2O_3$(c) | Cl: 0.05% | $AlCl_3$: 5.0%, NO: 10.0%, $H_2$: 3.0%, Ar: Balance | 50 | 1000 |
| $Al_2O_3$(d) | Cl: 0.1% | $AlCl_3$: 5.0%, NO: 5.0%, $H_2$: 3.0%, Ar: Balance | 50 | 950 |
| $Al_2O_3$(e) | Cl: 0.3% | $AlCl_3$: 5.0%, NO: 5.0%, $H_2$: 1.0%, Ar: Balance | 50 | 950 |
| $Al_2O_3$(f) | — | $AlCl_3$: 4.0%, $CO_2$: 12.0%, $H_2$: Balance | 50 | 1000 |

TABLE 4

Hard Coating Layer (Figure in parentheses means designed thickness)

| Insert | | Substrate | First Layer | Second Layer | Third Layer | Fourth Layer | Fifth Layer | Sixth Layer |
|---|---|---|---|---|---|---|---|---|
| This Invention | 1 | A | TiN (0.3) | l-TiCN (5) | TiCO (0.3) | $Al_2O_3$ (a) (5) | TiN (0.3) | |
| | 2 | A | TiN (0.3) | l-TiCN (5) | TiCO (0.3) | $Al_2O_3$ (b) (8) | TiN (0.3) | |
| | 3 | B | TiC (6) | TiCO (0.3) | $Al_2O_3$ (c) (6) | | | |
| | 4 | B | TiC (6) | TiCO (0.3) | $Al_2O_3$ (c) (6) | TiN (0.3) | | |
| | 5 | C | p-TiCN (6) | TiCO (0.3) | $Al_2O_3$ (c) (3) | TiN (0.3) | | |
| | 6 | C | p-TiCN (6) | TiCO (0.3) | $Al_2O_3$ (c) (6) | TiN (0.3) | | |
| | 7 | D | TiN (0.3) | l-TiCN (5) | TiCO (0.3) | $Al_2O_3$ (c) (6) | TiN (0.3) | |
| | 8 | D | TiN (0.3) | l-TiCN (5) | $TiO_2$ (0.3) | $Al_2O_3$ (c) (10) | | |
| | 9 | E | TiC (2) | TiCNO (0.3) | $Al_2O_3$ (d) (1.0) | TiN (0.3) | | |
| | 10 | E | p-TiCN (2) | TiNO (0.3) | $Al_2O_3$ (e) (2.0) | TiN (0.3) | | |

TABLE 5

| Insert | | Substrate | First Layer | Second Layer | Third Layer | Fourth Layer | Fifth Layer | Sixth Layer |
|---|---|---|---|---|---|---|---|---|
| Conven- | 1 | A | TiN (0.3) | l-TiCN (5) | TiCO (0.3) | $Al_2O_3$ (f) (5) | TiN (0.3) | |
| tional | 2 | A | TiN (0.3) | l-TiCN (5) | TiCO (0.3) | $Al_2O_3$ (f) (8) | TiN (0.3) | |
| | 3 | B | TiC (6) | TiCO (0.3) | $Al_2O_3$ (f) (6) | | | |
| | 4 | B | TiC (6) | TiCO (0.3) | $Al_2O_3$ (f) (6) | TiN (0.3) | | |
| | 5 | C | p-TiCN (6) | TiCO (0.3) | $Al_2O_3$ (f) (3) | TiN (0.3) | | |
| | 6 | C | p-TiCN (6) | TiCO (0.3) | $Al_2O_3$ (f) (6) | TiN (0.3) | | |
| | 7 | D | TiN (0.3) | l-TiCN (5) | TiCO (0.3) | $Al_2O_3$ (f) (6) | TiN (0.3) | |
| | 8 | D | TiN (0.3) | l-TiCN (5) | $TiO_2$ (0.3) | $Al_2O_3$ (f) (10) | | |
| | 9 | E | TiC (2) | TiCNO (0.3) | $Al_2O_3$ (f) (1.0) | TiN (0.3) | | |
| | 10 | E | p-TiCN (2) | TiNO (0.3) | $Al_2O_3$ (f) (2.0) | TiN (0.3) | | |

TABLE 6

| | | Thickness of $Al_2O_3$ Layer ($\mu$m) | | | Flank Wear (mm) | |
|---|---|---|---|---|---|---|
| Insert | | Flank | Edge | Rake | Continuous Cutting | Interrupted Cutting |
| This | 1 | 5.0 | 5.5 | 4.8 | 0.25 | 0.26 |
| Invention | 2 | 8.1 | 9.2 | 7.6 | 0.29 | 0.22 |
| | 3 | 6.0 | 6.8 | 6.0 | 0.27 | 0.23 |
| | 4 | 6.2 | 7.0 | 5.7 | 0.25 | 0.21 |
| | 5 | 2.9 | 3.3 | 2.7 | 0.26 | 0.31 |
| | 6 | 6.0 | 6.8 | 5.6 | 0.33 | 0.27 |
| | 7 | 6.0 | 6.8 | 5.5 | 0.31 | 0.30 |
| | 8 | 9.8 | 11.2 | 9.3 | 0.29 | 0.21 |
| | 9 | 1.0 | 1.1 | 0.9 | — | 0.22 |
| | 10 | 2.0 | 2.1 | 1.9 | — | 0.29 |

TABLE 7

| | | Thickness of $Al_2O_3$ Layer ($\mu$m) | | | Flank Wear (mm) | |
|---|---|---|---|---|---|---|
| Insert | | Flank | Edge | Rake | Continuous Cutting | Interrupted Cutting |
| Conven- | 1 | 4.8 | 8.2 | 2.1 | 0.31 | Failure at 4.5 minutes |
| tional | 2 | 7.8 | 14.0 | 3.1 | 0.34 | Failure at 2.0 minutes |
| | 3 | 5.9 | 9.8 | 2.6 | 0.33 | Failure at 1.5 minutes |
| | 4 | 6.0 | 9.2 | 3.4 | 0.38 | Failure at 2.5 minutes |
| | 5 | 3.0 | 4.6 | 1.8 | 0.39 | Failure at 2.5 minutes |
| | 6 | 5.8 | 9.1 | 3.0 | 0.49 | Failure at 3.0 minutes |
| | 7 | 6.0 | 10.2 | 2.4 | 0.31 | Failure at 2.0 minutes |
| | 8 | 9.9 | 17.1 | 4.6 | 0.44 | Failure at 2.0 minutes |
| | 9 | 1.0 | 1.5 | 0.6 | — | Failure at 4.5 minutes |
| | 10 | 2.0 | 3.4 | 1.2 | — | Failure at 2.5 minutes |

Remark: Failure is caused by chipping.

TABLE 8

| Hard Coating Layer | | Conditions for Forming Hard Coating Layer | | |
|---|---|---|---|---|
| Kind | Designed Ti and Cl Content (weight %) | Composition of Reactive Gas (Volume %) | Pressure (torr) | Temperature (° C.) |
| $Al_2O_3$(a) | Ti: 1.5%, Cl: 0.07% | NO: 12.3%, $H_2$: 2.5%, $AlCl_3$: 5.7%, $TiCl_4$: 0.33%, Ar: Balance | 20 | 950 |
| $Al_2O_3$(b) | Ti: 5%, Cl: 0.07% | NO: 12.3%, $H_2$: 2.5%, $AlCl_3$: 5.7%, $TiCl_4$: 0.33%, Ar: Balance | 50 | 950 |
| $Al_2O_3$(c) | Ti: 10%, Cl: 0.07% | NO: 12.3%, $H_2$: 2.5%, $AlCl_3$: 5.7%, $TiCl_4$: 0.33%, Ar: Balance | 200 | 950 |
| $Al_2O_3$(d) | Ti: 15%, Cl: 0.07% | NO: 12.3%, $H_2$: 4.0%, $AlCl_3$: 5.7%, $TiCl_4$: 0.7%, Ar: Balance | 50 | 950 |
| $Al_2O_3$(e) | Ti: 5%, Cl: 0.005% | NO: 12.3%, $H_2$: 3.0%, $AlCl_3$: 5.7%, $TiCl_4$: 0.33%, Ar: Balance | 50 | 950 |
| $Al_2O_3$(f) | Ti: 5%, Cl: 0.1% | NO: 12.3%, $H_2$: 2.0%, $AlCl_3$: 5.7%, $TiCl_4$: 0.33%, Ar: Balance | 50 | 950 |
| $Al_2O_3$(g) | Ti: 10%, Cl: 0.005% | NO: 12.3%, $H_2$: 2.5%, $AlCl_3$: 5.7%, $TiCl_4$: 0.33%, Ar: Balance | 50 | 900 |
| $Al_2O_3$(h) | Ti: 2.5%, Cl: 0.1% | NO: 12.3%, $H_2$: 2.5%, $AlCl_3$: 5.7%, $TiCl_4$: 0.33%, Ar: Balance | 50 | 1050 |
| $Al_2O_3$(i) | — | $CO_2$: 6.5%, $AlCl_3$: 2%, $H_2$: Balance | 50 | 980 |

TABLE 9

| Insert | | Substrate | First Layer | Second Layer | Third Layer | Fourth Layer | Fifth Layer | Sixth Layer |
|---|---|---|---|---|---|---|---|---|
| This | 11 | A | TiN (0.1) | l-TiCN (7) | TiCNO (0.1) | $Al_2O_3$ (a) (6) | TiN (0.1) | — |
| Invention | 12 | A | TiN (0.1) | l-TiCN (7) | TiCNO (0.1) | $Al_2O_3$ (b) (6) | TiN (0.1) | — |

TABLE 9-continued

| | | Hard Coating Layer (Figure in parentheses means designed thickness) | | | | | |
|---|---|---|---|---|---|---|---|
| Insert | Substrate | First Layer | Second Layer | Third Layer | Fourth Layer | Fifth Layer | Sixth Layer |
| 13 | A | TiN (0.1) | l-TiCN (7) | TiCNO (0.1) | Al₃O₃ (b) (10) | TiN (0.1) | — |
| 14 | A | TiN (0.1) | l-TiCN (7) | TiCNO (0.1) | Al₂O₃ (b) (4) | TiN (0.1) | — |
| 15 | A | TiN (0.1) | p-TiCN (7) | TiCNO (0.1) | Al₂O₃ (b) (6) | TiN (0.1) | — |
| 16 | A | TiN (0.1) | l-TiCN (7) | TiCNO (0.1) | Al₂O₃ (b) (6) | — | — |
| 17 | A | TiC (1) | p-TiCN (2) | TiC (5) | TiCNO (0.1) | Al₂O₃ (b) (6) | TiN (0.1) |
| 18 | A | TiN (0.1) | l-TiCN (5) | TiC (3) | Al₂O₃ (b) (6) | TiN (0.1) | — |
| 19 | A | TiN (0.1) | l-TiCN (5) | TiC (3) | TiNO (0.1) | Al₂O₃ (b) (6) | TiN (0.1) |
| 20 | A | TiN (0.1) | l-TiCN (5) | TiC (3) | TiCO (0.1) | Al₂O₃ (b) (6) | TiN (0.1) |
| 21 | A | TiN (0.1) | l-TiCN (5) | TiC (3) | TiO₂ (0.1) | Al₂O₃ (b) (6) | TiN (0.1) |
| 22 | A | TiN (0.1) | l-TiCN (7) | TiNO (0.1) | Al₂O₃ (c) (6) | TiN (0.1) | — |
| 23 | A | TiN (0.1) | l-TiCN (7) | TiNO (0.1) | Al₂O₃ (d) (6) | TiN (0.1) | — |
| 24 | B | TiN (0.1) | l-TiCN (7) | TiCO (0.1) | Al₃O₃ (e) (6) | TiN (0.1) | — |

TABLE 10

| | | | Hard Coating Layer (figure in parentheses means designed thickness) | | | | |
|---|---|---|---|---|---|---|---|
| Insert | | Substrate | First Layer | Second Layer | Third Layer | Fourth Layer | Fifth Layer | Sixth Layer |
| This Invention | 25 | C | TiN (0.1) | l-TiCN (2) | TiCO (0.1) | Al₂O₃ (f) (3) | TiN (0.1) | — |
| | 26 | D | TiN (0.1) | l-TiCN (7) | TiO₂ (0.1) | Al₂O₃ (g) (6) | TiN (0.1) | — |
| | 27 | E | TiN (0.1) | l-TiCN (0.5) | TiO₂ (0.1) | Al₂O₃ (h) (2.5) | TiN (0.1) | — |
| Conventional | 11 | A | TiN (0.1) | l-TiCN (7) | TiCNO (0.1) | Al₂O₃ (i) (6) | TiN (0.1) | — |
| | 12 | A | TiN (0.1) | l-TiN (7) | TiCNO (0.1) | Al₂O₃ (i) (10) | TiN (0.1) | — |
| | 13 | A | TiN (0.1) | l-TiCN (7) | TiCNO (0.1) | Al₂O₃ (i) (4) | TiN (0.1) | — |
| | 14 | A | TiN (0.1) | p-TiN (7) | TiCNO (0.1) | Al₂O₃ (i) (6) | TiN (0.1) | — |
| | 15 | A | TiC (1) | l-TiCN (7) | TiCNO (0.1) | Al₂O₃ (i) (6) | — | — |
| | 16 | A | TiN (0.1) | l-TiCN (2) | TiC (3) | TiCNO (0.1) | Al₂O₃ (i) (6) | TiN (0.1) |
| | 17 | B | TiN (0.1) | l-TiCN (5) | TiC (3) | Al₂O₃ (i) (6) | TiN (0.1) | — |
| | 18 | C | TiN (0.1) | l-TiCN (2) | TiNO (0.1) | Al₂O₃ (i) (3) | TiN (0.1) | — |
| | 19 | D | TiN (0.1) | l-TiCN (5) | TiC (3) | TiCO (0.1) | Al₂O₃ (i) (6) | TiN (0.1) |
| | 20 | E | TiN (0.1) | l-TiCN (0.5) | TiO₂ (0.1) | Al₂O₃ (i) (2.5) | TiN (0.1) | — |

TABLE 11

| | | Thickness of Al₂O₃ Layer (μm) | | | Flank Wear (mm) | |
|---|---|---|---|---|---|---|
| Insert | | Flank | Edge | Rake | Continuous Cutting | Interrupted Cutting |
| This Invention | 11 | 6.2 | 8.3 | 5.8 | 0.19 | 0.23 |
| | 12 | 6.2 | 8.3 | 6.0 | 0.16 | 0.20 |
| | 13 | 10.3 | 13.2 | 9.9 | 0.16 | 0.21 |
| | 14 | 3.9 | 5.2 | 4.0 | 0.17 | 0.20 |
| | 15 | 6.1 | 8.2 | 6.0 | 0.18 | 0.20 |
| | 16 | 6.0 | 8.3 | 5.9 | 0.17 | 0.22 |
| | 17 | 6.2 | 8.3 | 5.9 | 0.18 | 0.21 |
| | 18 | 6.2 | 8.2 | 6.0 | 0.17 | 0.23 |
| | 19 | 6.0 | 8.2 | 5.9 | 0.20 | 0.23 |
| | 20 | 6.1 | 8.3 | 6.0 | 0.20 | 0.23 |
| | 21 | 6.0 | 8.2 | 5.9 | 0.19 | 0.26 |
| | 22 | 6.2 | 8.2 | 6.1 | 0.23 | 0.27 |
| | 23 | 6.1 | 8.3 | 6.2 | 0.24 | 0.26 |
| | 24 | 6.0 | 7.9 | 6.0 | 0.19 | 0.27 |

Remark: Failure is caused by chipping.

TABLE 12

| | | Thickness of Al₂O₃ Layer (μm) | | | Flank Wear (mm) | |
|---|---|---|---|---|---|---|
| Insert | | Flank | Edge | Rake | Continuous Cutting | Interrupted Cutting |
| This Invention | 25 | 3.1 | 3.9 | 2.9 | 0.21 | 0.23 |
| | 26 | 6.2 | 8.0 | 6.1 | 0.24 | 0.30 |
| | 27 | 2.5 | 3.3 | 2.2 | — | 0.24 |
| Conventional Method | 11 | 6.1 | 11.2 | 3.0 | 0.20 | Failure at 4.0 minutes |
| | 12 | 10.2 | 18.5 | 5.0 | 0.20 | Failure at 4.0 minutes |
| | 13 | 4.0 | 7.5 | 2.1 | 0.21 | Failure at 4.0 minutes |
| | 14 | 6.0 | 11.0 | 2.9 | 0.21 | Failure at 4.5 minutes |
| | 15 | 5.9 | 10.8 | 3.0 | 0.28 | Failure at 3.5 minutes |
| | 16 | 6.1 | 11.3 | 3.2 | 0.27 | Failure at 3.0 minutes |
| | 17 | 6.0 | 11.2 | 3.0 | 0.20 | Failure at 2.5 minutes |
| | 18 | 3.0 | 5.2 | 1.4 | 0.25 | Failure at 3.5 minutes |
| | 19 | 5.9 | 11.0 | 3.0 | 0.31 | Failure at 2.5 minutes |
| | 20 | 2.5 | 4.3 | 1.4 | — | Failure at 3.5 minutes |

Remark: Failure is caused by chipping.

TABLE 13

| | Hard Coating Layer | | | Conditions for Forming Hard Coating Layer | | | | | | | |
|---|---|---|---|---|---|---|---|---|---|---|---|
| | Designed Content | | | Composition of Reactive Gas | | | | | | Conditions | |
| | (weight %) | | | (Volume %) | | | | | | Pressure | Temperature |
| Kind | Zr | Hf | Cl | AlCl$_3$ | NO | ZrCl$_4$ | HfCl$_4$ | H$_2$ | Ar | (torr) | (° C.) |
| Al$_2$O$_3$(a) | 0.2 | 0.3 | 0.03 | 3 | 10 | 0.04 | 0.06 | 3 | Balance | 50 | 950 |
| Al$_2$O$_3$(b) | 1.5 | 1.5 | 0.03 | 3 | 10 | 0.1 | 0.1 | 3 | Balance | 50 | 950 |
| Al$_2$O$_3$(c) | 5 | 5 | 0.03 | 3 | 10 | 0.3 | 0.3 | 3 | Balance | 50 | 950 |
| Al$_2$O$_3$(d) | 1.5 | 1.5 | 0.005 | 3 | 10 | 0.1 | 0.1 | 5 | Balance | 50 | 1000 |
| Al$_2$O$_3$(e) | 1.5 | 1.5 | 0.1 | 3 | 10 | 0.1 | 0.1 | 1 | Balance | 50 | 900 |
| Al$_2$O$_3$(f) | 0.5 | — | 0.01 | 4 | 8 | 0.1 | — | 4 | Balance | 50 | 950 |
| Al$_2$O$_3$(g) | 10 | — | 0.01 | 4 | 8 | 0.6 | — | 4 | Balance | 50 | 950 |
| Al$_2$O$_3$(h) | — | 0.5 | 0.05 | 5 | 12 | — | 0.1 | 2 | Balance | 50 | 950 |
| Al$_2$O$_3$(i) | — | 10 | 0.05 | 5 | 12 | — | 0.6 | 2 | Balance | 50 | 950 |
| Al$_2$O$_3$(j) | — | — | — | CO$_2$: 6.5%, AlCl$_3$: 2%, H$_2$: Balance | | | | | | 50 | 980 |

TABLE 14

| | Insert | Substrate | Hard Coating Layer (figure in parentheses means designed thickness) | | | | | |
|---|---|---|---|---|---|---|---|---|
| | | | First Layer | Second Layer | Third Layer | Fourth Layer | Fifth Layer | Sixth Layer |
| This Invention | 28 | A | TiN (0.1) | l-TiCN (7) | TiCNO (0.1) | Al$_2$O$_3$ (a) (3) | TiN (0.1) | — |
| | 29 | A | TiN (0.1) | l-TiCN (7) | TiCNO (0.1) | Al$_2$O$_3$ (b) (5) | TiN (0.1) | — |
| | 30 | A | TiN (0.1) | l-TiCN (7) | TiCNO (0.1) | Al$_2$O$_3$ (b) (7) | TiN (0.1) | — |
| | 31 | A | TiN (0.1) | l-TiCN (7) | TiCNO (0.1) | Al$_2$O$_3$ (b) (9) | TiN (0.1) | — |
| | 32 | A | TiN (0.1) | l-TiCN (7) | TiCNO (0.1) | Al$_2$O$_3$ (b) (9) | — | — |
| | 33 | B | p-TiCN (6) | TiNO (0.1) | Al$_2$O$_3$ (b) (6) | TiO$_2$ (0.1) | TiN (0.1) | — |
| | 34 | B | TiC (7) | TiCO (0.1) | Al$_2$O$_3$ (c) (5) | — | — | — |
| | 35 | C | TiN (0.1) | l-TiCN (5) | TiC (3) | p-TiCN (0.1) | Al$_2$O$_3$ (d) (4) | TiN (0.1) |
| | 36 | C | p-TiCN (7) | Al$_2$O$_3$ (e) (6) | — | — | — | — |
| | 37 | D | TiN (0.3) | l-TiCN (6) | TiCNO (0.1) | Al$_2$O$_3$ (f) (7) | TiN (0.1) | — |
| | 38 | D | p-TiCN (6) | TiCNO (0.1) | Al$_2$O$_3$ (g) (7) | — | — | — |
| | 39 | E | TiC (0.5) | Al$_2$O$_3$ (h) (3) | — | — | — | — |
| | 40 | E | TiN (0.1) | l-TiCN (0.5) | TiNO (0.1) | Al$_2$O$_3$ (i) (2.5) | TiN (0.1) | — |

TABLE 15

| | Insert | Substrate | Hard Coating Layer (figure in parentheses means designed thickness) | | | | | |
|---|---|---|---|---|---|---|---|---|
| | | | First Layer | Second Layer | Third Layer | Fourth Layer | Fifth Layer | Sixth Layer |
| Conventional | 21 | A | TiN (0.1) | l-TiCN (7) | TiCNO (0.1) | Al$_2$O$_3$ (j) (9) | TiN (0.1) | — |
| | 21 | A | TiN (0.1) | l-TiCN (7) | TiCNO (0.1) | Al$_2$O$_3$ (j) (9) | TiN (0.1) | — |
| | 22 | A | TiN (0.1) | l-TiCN (7) | TiCNO (0.1) | Al$_2$O$_3$ (j) (9) | — | — |
| | 23 | B | p-TiCN (6) | TiNO (0.1) | Al$_2$O$_3$ (j) (6) | TiO$_2$ (0.1) | TiN (0.1) | — |
| | 24 | B | TiC (7) | TiCO (0.1) | Al$_2$O$_3$ (j) (5) | — | — | — |
| | 25 | C | TiN (0.1) | l-TiCN (5) | TiC (3) | p-TiCN (0.1) | Al$_2$O$_3$ (j) (4) | TiN (0.1) |
| | 26 | C | p-TiCN (7) | Al$_2$O$_3$ (j) (6) | — | — | — | — |
| | 27 | D | TiN (0.3) | l-TiCN (6) | TiCNO (0.1) | Al$_2$O$_3$ (j) (7) | TiN (0.1) | — |
| | 28 | D | p-TiCN (6) | TiCNO (0.1) | Al$_2$O$_3$ (j) (7) | — | — | — |
| | 29 | E | TiC (0.5) | Al$_2$O$_3$ (j) (3) | — | — | — | — |
| | 30 | E | TiN (0.1) | l-TiCN (0.5) | TiNO (0.1) | Al$_2$O$_3$ (j) (2.5) | TiN (0.1) | — |

TABLE 16

| | Insert | Thickness of Al$_2$O$_3$ Layer (μm) | | | Flank Wear (mm) | |
|---|---|---|---|---|---|---|
| | | Flank | Edge | Rake | Continuous Cutting | Interrupted Cutting |
| This Invention | 28 | 3.0 | 3.7 | 2.9 | 0.20 | 0.25 |
| | 29 | 5.0 | 5.9 | 4.8 | 0.20 | 0.27 |
| | 30 | 7.1 | 8.2 | 6.7 | 0.19 | 0.26 |
| | 31 | 9.2 | 10.4 | 8.7 | 0.19 | 0.25 |
| | 32 | 9.0 | 10.5 | 8.6 | 0.18 | 0.29 |
| | 33 | 5.9 | 7.0 | 5.7 | 0.26 | 0.30 |
| | 34 | 5.0 | 6.0 | 4.8 | 0.23 | 0.31 |
| | 35 | 4.0 | 4.6 | 3.9 | 0.25 | 0.26 |
| | 36 | 6.0 | 7.0 | 5.8 | 0.27 | 0.22 |
| | 37 | 6.9 | 8.5 | 6.6 | 0.17 | 0.20 |
| | 38 | 7.0 | 8.3 | 6.9 | 0.17 | 0.24 |

TABLE 16-continued

| Insert | Thickness of Al$_2$O$_3$ Layer (μm) | | | Flank Wear (mm) | |
|---|---|---|---|---|---|
| | Flank | Edge | Rake | Continuous Cutting | Interrupted Cutting |
| 39 | 3.0 | 3.4 | 3.0 | — | 0.25 |
| 40 | 2.5 | 2.9 | 2.4 | — | 0.24 |

TABLE 17

| Insert | | Thickness of Al$_2$O$_3$ Layer (μm) | | | Flank Wear (mm) | |
|---|---|---|---|---|---|---|
| | | Flank | Edge | Rake | Continuous Cutting | Interrupted Cutting |
| Conventional | 21 | 8.8 | 15.2 | 3.9 | 0.22 | Failure at 3.5 minutes |
| | 22 | 9.0 | 16.8 | 4.7 | 0.25 | Failure at 3.0 minutes |
| | 23 | 6.0 | 10.4 | 2.7 | 0.32 | Failure at 3.0 minutes |
| | 24 | 4.9 | 8.8 | 2.5 | 0.33 | Failure at 3.5 minutes |
| | 25 | 4.0 | 6.9 | 1.8 | 0.31 | Failure at 4.5 minutes |
| | 26 | 5.8 | 10.2 | 2.7 | 0.27 | Failure at 4.0 minutes |
| | 27 | 6.9 | 12.4 | 3.0 | 0.22 | Failure at 4.0 minutes |
| | 28 | 7.0 | 13.0 | 3.0 | 0.23 | Failure at 3.5 minutes |
| | 29 | 3.0 | 4.9 | 1.6 | — | Failure at 5.5 minutes |
| | 30 | 2.5 | 4.7 | 1.4 | — | Failure at 6.5 minutes |

Remark: Failure is caused by chipping.

TABLE 18

| | Hard Coating Layer | | | | Conditions for Forming Hard Coating Layer | | | | | | | | Conditions | |
|---|---|---|---|---|---|---|---|---|---|---|---|---|---|---|
| | Designed Content (weight %) | | | | Composition of Reactive Gas (Volume %) | | | | | | | | Temperature | Pressure |
| Kind | Ti | Cl | Zr | Hf | AlCl$_3$ | NO | TiCl$_4$ | ZrCl$_4$ | HfCl$_4$ | H$_2$ | Ar | He | (°C.) | (torr) |
| Al$_2$O$_3$(a) | 1.5 | 0.03 | 1.5 | 1.5 | 5 | 15 | 0.1 | 0.1 | 0.1 | 2.5 | Balance | — | 950 | 50 |
| Al$_2$O$_3$(b) | 5 | 0.03 | 1.5 | 1.5 | 5 | 15 | 0.3 | 0.1 | 0.1 | 2.5 | Balance | — | 950 | 50 |
| Al$_2$O$_3$(c) | 15 | 0.03 | 1.0 | 1.0 | 5 | 15 | 0.7 | 0.05 | 0.05 | 2.5 | Balance | — | 930 | 50 |
| Al$_2$O$_3$(d) | 5 | 0.005 | 1.0 | 2.0 | 5 | 10 | 0.3 | 0.05 | 0.1 | 1 | — | Balance | 980 | 30 |
| Al$_2$O$_3$(e) | 5 | 0.1 | 2.0 | 1.0 | 5 | 10 | 0.3 | 0.1 | 0.05 | 2.5 | — | Balance | 900 | 100 |
| Al$_2$O$_3$(f) | 5 | 0.03 | 0.2 | 0.3 | 5 | 10 | 0.4 | 0.01 | 0.02 | 1 | — | Balance | 980 | 30 |
| Al$_2$O$_3$(g) | 5 | 0.03 | 5 | 5 | 5 | 10 | 0.3 | 0.3 | 0.3 | 1 | — | Balance | 980 | 30 |
| Al$_2$O$_3$(h) | 5 | 0.03 | 10 | — | 4 | 5 | 0.3 | 0.6 | — | 3.0 | Balance | — | 920 | 100 |
| Al$_2$O$_3$(i) | 5 | 0.03 | — | 0.5 | 4 | 5 | 0.4 | — | 0.03 | 3.0 | Balance | — | 920 | 100 |
| Al$_2$O$_3$(j) | 2 | 0.03 | 0.5 | — | 4 | 5 | 0.15 | 0.03 | — | 3.0 | Balance | — | 920 | 100 |
| Al$_2$O$_3$(k) | 3 | 0.03 | — | 10 | 4 | 5 | 0.2 | — | 0.6 | 3.0 | Ealance | — | 920 | 100 |
| Al$_2$O$_3$(l) | | | | | AlCl$_3$: 2.0%, CO$_2$: 6.5%, H$_2$: Balance | | | | | | | | 980 | 50 |

TABLE 19

Hard Coating Layer (figure in parentheses means designed thickness)

| | Insert | Substrate | First Layer | Second Layer | Third Layer | Fourth Layer | Fifth Layer | Sixth Layer |
|---|---|---|---|---|---|---|---|---|
| This Invention | 41 | A | TiN (0.1) | l-TiCN (7) | TiCNO (0.1) | Al$_2$O$_3$ (a) (11) | TiN (0.1) | — |
| | 42 | A | TiN (0.1) | l-TiCN (7) | TiCNO (0.1) | Al$_2$O$_3$ (b) (9) | TiN (0.1) | — |
| | 43 | A | TiN (0.1) | l-TiCN (7) | TiCNO (0.1) | Al$_2$O$_3$ (b) (7) | TiN (0.1) | — |
| | 44 | A | TiN (0.1) | l-TiCN (7) | TiCNO (0.1) | Al$_2$O$_3$ (b) (5) | TiN (0.1) | — |
| | 45 | A | TiN (0.1) | p-TiCN (7) | TiCNO (0.1) | Al$_2$O$_3$ (b) (3) | TiN (0.1) | — |
| | 46 | A | TiN (0.1) | l-TiCN (7) | TiCNO (0.1) | Al$_2$O$_3$(b) (3) | — | — |
| | 47 | A | TiC (1) | p-TiCN (2) | TiC (5) | TiCNO (0.1) | Al$_2$O$_3$ (b) (6) | TiN (0.1) |
| | 48 | A | TiN (0.1) | l-TiCN (5) | TiC (3) | Al$_2$O$_3$ (b) (6) | TiN (0.1) | — |
| | 49 | A | TiN (0.1) | l-TiCN (5) | TiC (3) | TiNO (0.1) | Al$_2$O$_3$ (c) (6) | TiN (0.1) |
| | 50 | B | TiN (0.1) | l-TiCN (3) | TiC (2) | TiCO (0.1) | Al$_2$O$_3$ (d) (8) | TiN (0.1) |
| | 51 | B | TiN (0.1) | l-TiCN (3) | TiC (2) | TiO$_2$ (0.1) | Al$_2$O$_3$ (e) (8) | TiN (0.1) |
| | 52 | C | TiN (0.1) | l-TiCN (5) | TiNO (0.1) | Al$_2$O$_3$ (f) (2) | TiN (0.1) | — |
| | 53 | C | TiN (0.1) | l-TiCN (5) | TiNO (0.1) | Al$_2$O$_3$ (g) (2) | TiN (0.1) | — |
| | 54 | D | TiN (0.1) | l-TiCN (3) | TiCO (0.1) | Al$_2$O$_3$ (h) (10) | TiN (0.1) | — |

TABLE 20

| Insert | | Substrate | Hard Coating Layer (figure in parentheses means designed thickness) | | | | | |
|---|---|---|---|---|---|---|---|---|
| | | | First Layer | Second Layer | Third Layer | Fourth Layer | Fifth Layer | Sixth Layer |
| This Invention | 55 | D | TiN (0.1) | l-TiCN (3) | TiCO (0.1) | $Al_2O_3$ (j) (10) | TiN (0.1) | — |
| | 56 | E | TiN (0.1) | l-TiCN (0.5) | $TiO_2$ (0.1) | $Al_2O_3$ (j) (2.5) | — | — |
| | 57 | E | TiN (0.1) | l-TiCN (0.5) | $TiO_2$ (0.1) | $Al_2O_3$ (k) (2.5) | — | — |
| Conventional | 31 | A | TiN (0.1) | l-TiCN (7) | TiCNO (0.1) | $Al_2O_3$ (l) (11) | TiN (0.1) | — |
| | 32 | A | TiN (0.1) | l-TiCN (7) | TiCNO (0.1) | $Al_2O_3$ (l) (7) | TiN (0.1) | — |
| | 33 | A | TiN (0.1) | l-TiCN (7) | TiCNO (0.1) | $Al_2O_3$ (l) (5) | TiN (0.1) | — |
| | 34 | A | TiN (0.1) | p-TiCN (7) | TiCNO (0.1) | $Al_2O_3$ (l) (3) | TiN (0.1) | — |
| | 35 | A | TiC (1) | l-TiCN (7) | TiCNO (0.1) | $Al_2O_3$ (l) (6) | — | — |
| | 36 | A | TiN (0.1) | l-TiCN (2) | TiC (3) | TiCNO (0.1) | $Al_2O_3$ (l) (6) | TiN (0.1) |
| | 37 | B | TiN (0.1) | l-TiCN (3) | TiC (2) | $TiO_2$ (0.1) | $Al_2O_3$ (l) (8) | TiN (0.1) |
| | 38 | C | TiN (0.1) | l-TiCN (5) | TiNO (0.1) | $Al_2O_3$ (l) (2) | TiN (0.1) | — |
| | 39 | D | TiN (0.1) | l-TiCN (3) | TiCO (0.1) | $Al_2O_3$ (l) (10) | TiN (0.1) | — |
| | 40 | E | TiN (0.1) | l-TiCN (0.5) | $TiO_2$ (0.1) | $Al_2O_3$ (l) (2.5) | — | — |

TABLE 21

| Insert | | Thickness of $Al_2O_3$ Layer (μm) | | | Flank Wear (mm) | |
|---|---|---|---|---|---|---|
| | | Flank | Edge | Rake | Continuous Cutting | Interrupted Cutting |
| This Invention | 41 | 11.1 | 13.3 | 10.3 | 0.29 | 0.30 |
| | 42 | 9.0 | 11.1 | 8.6 | 0.22 | 0.27 |
| | 43 | 7.1 | 9.0 | 6.8 | 0.24 | 0.21 |
| | 44 | 5.0 | 6.0 | 5.0 | 0.24 | 0.24 |
| | 45 | 3.0 | 3.3 | 2.9 | 0.27 | 0.27 |
| | 46 | 3.0 | 3.5 | 2.8 | 0.30 | 0.29 |
| | 47 | 6.2 | 7.7 | 5.9 | 0.28 | 0.25 |
| | 48 | 6.2 | 7.5 | 6.0 | 0.22 | 0.31 |
| | 49 | 6.0 | 8.2 | 5.9 | 0.24 | 0.24 |
| | 50 | 7.9 | 9.3 | 7.5 | 0.19 | 0.27 |
| | 51 | 8.0 | 10.0 | 7.7 | 0.17 | 0.22 |
| | 52 | 2.0 | 2.1 | 2.0 | 0.27 | 0.19 |
| | 53 | 2.0 | 2.2 | 2.0 | 0.27 | 0.16 |
| | 54 | 10.3 | 12.8 | 9.4 | 0.17 | 0.19 |

TABLE 2

| Insert | | Thickness of $Al_2O_3$ Layer (μm) | | | Flank Wear (mm) | |
|---|---|---|---|---|---|---|
| | | Flank | Edge | Rake | Continuous Cutting | Interrupted Cutting |
| This Invention | 55 | 10.1 | 12.4 | 9.6 | 0.18 | 0.19 |
| | 56 | 2.4 | 3.3 | 2.2 | — | 0.26 |
| | 57 | 2.5 | 3.0 | 2.2 | — | 0.21 |
| Conventional | 31 | 10.5 | 18.7 | 5.0 | 0.20 | Failure at 2.5 minutes |
| | 32 | 7.1 | 12.0 | 3.1 | 0.20 | Failure at 2.5 minutes |
| | 33 | 4.8 | 7.9 | 2.4 | 0.21 | Failure at 3.5 minutes |
| | 34 | 3.0 | 5.4 | 1.4 | 0.21 | Failure at 3.0 minutes |
| | 35 | 5.9 | 10.8 | 3.0 | 0.21 | Failure at 1.5 minutes |
| | 36 | 6.1 | 11.3 | 3.2 | 0.22 | Failure at 2.0 minutes |
| | 37 | 7.9 | 13.8 | 3.3 | 0.23 | Failure at 4.0 minutes |
| | 38 | 2.0 | 4.0 | 0.9 | 0.21 | Failure at 4.5 minutes |
| | 39 | 9.6 | 17.0 | 4.4 | 0.23 | Failure at 3.5 minutes |
| | 40 | 2.5 | 4.4 | 1.2 | — | Failure at 2.5 minutes |

Remark: Failure is caused by chipping.

As set forth above, the coated carbide cutting member in accordance with the present invention has hard coating layers comprising an $Al_2O_3$-based layer in which Cl is included using a reactive gas diluted with an inert gas, and the $Al_2O_3$-based layer has a fine crystalline structure. In contrast, since conventional coated carbide cutting members use a hydrogen-based reactive gas to form the $Al_2O_3$ coating layer, the resulting $Al_2O_3$ layer has a coarse crystalline structure, and the thicknesses of the flank, rake and edge fluctuate significantly. Thus, the coated carbide cutting member in accordance with the present invention exhibits excellent wear resistance to continuous cutting of steel and cast iron and significantly improved resistance against chipping in interrupted cutting, without losing the excellent characteristics of the $Al_2O_3$ layer.

In particular, the local fluctuation of the thickness of the $Al_2O_3$-based layer is extremely low in the coated carbide cutting member in accordance with the present invention even when the $Al_2O_3$-based layer is thickened. Thus, the present coated carbide cutting member exhibits significantly improved resistance against chipping in both continuous and interrupted cutting of metals, such as steel and cast iron, and exhibits long term excellent cutting characteristics. Such advantages contribute to improvements in factory automation and labor saving in relation to cutting operations.

This application is based on Japanese Patent Applications 08-009930 (filed Jan. 24, 1996); 08-068115 (filed Mar. 25, 1996); 08-068120 (filed Mar. 25, 1996); and 08-093967 (filed Apr. 16, 1996), all filed with the Japanese Patent Office, the entire contents of each of which are hereby incorporated by reference.

Obviously, numerous modifications and variations of the present invention are possible in light of the above teachings. It is therefore to be understood that within the scope of the appended claims, the invention may be practiced otherwise than as specifically described herein.

What is claimed is as new and desired to be secured by Letters Patent of the United States is:

1. A coated carbide alloy cutting member comprising:
a cemented carbide substrate and a plurality of hard coating layers, wherein said hard coating layers comprise a layer consisting essentially of aluminum oxide, 1.5 to 15 percent by weight of titanium and 0.02 to 0.5 percent by weight of chlorine, and at least one additional layer selected from the group consisting of a titanium carbide layer, a titanium nitride layer, a titanium carbonitride layer, a titanium oxide layer, a titanium carboxide layer, a titanium nitroxide layer and a titanium carbonitroxide layer; said hard coating layers having an average thickness of 3 to 20 μm and being formed on said cemented carbide substrate by chemical and/or physical vapor deposition.

2. The coated carbide alloy cutting member as claimed in claim 1, wherein said aluminum oxide-containing layer further contains 0.5 to 10 percent by weight of zirconium or hafnium or both.

3. The coated carbide cutting member as claimed in claim 1, wherein said aluminum oxide-containing layer contains from 0.05 to 0.3 percent by weight of chlorine.

4. The coated carbide cutting member as claimed in claim 1, wherein said aluminum oxide-containing layer contains a total amount of titanium, chlorine, zirconium and hafnium combined of no more than 17.5 percent by weight.

5. The coated carbide cutting member as claimed in claim 1, wherein said cemented carbide substrate comprises tungsten carbide, Co and one or more members selected from the group consisting of (Ti,W)C, (Ti,W)CN and (Ta,Nb)C.

* * * * *